(12) United States Patent
Paduvalli

(10) Patent No.: US 10,175,278 B1
(45) Date of Patent: Jan. 8, 2019

(54) DETECTING VALUE OF OUTPUT CAPACITOR IN SWITCHING REGULATOR

(71) Applicant: Linear Technology Holding LLC, Norwood, MA (US)

(72) Inventor: Vikas V. Paduvalli, San Jose, CA (US)

(73) Assignee: LINEAR TECHNOLOGY HOLDING LLC, Norwood, MA (US)

( * ) Notice: Subject to any disclaimer, the term of this patent is extended or adjusted under 35 U.S.C. 154(b) by 0 days.

(21) Appl. No.: 15/960,246

(22) Filed: Apr. 23, 2018

(51) Int. Cl.
*G01R 27/26* (2006.01)
*H02M 3/158* (2006.01)

(52) U.S. Cl.
CPC ......... *G01R 27/2605* (2013.01); *G01R 27/26* (2013.01); *H02M 3/158* (2013.01)

(58) Field of Classification Search
CPC .... G01N 27/22–27/24; G01R 27/2605; G01R 27/26; H02M 3/158–3/1588
See application file for complete search history.

(56) References Cited

U.S. PATENT DOCUMENTS

| 6,509,745 B1 * | 1/2003 | Marszalek | ........... G01N 27/228 324/658 |
| 9,705,402 B1 * | 7/2017 | Carpenter, Jr. | .... H01H 85/0241 |
| 2007/0194800 A1 * | 8/2007 | Novikov | ............ G01R 27/2605 324/676 |
| 2009/0278716 A1 * | 11/2009 | Kawahito | ............ G11C 27/026 341/120 |
| 2016/0380543 A1 * | 12/2016 | Zhang | .................... H02M 3/158 323/271 |
| 2017/0205453 A1 * | 7/2017 | Bharathan | .......... G01R 27/2605 |

\* cited by examiner

*Primary Examiner* — Kyle J Moody
*Assistant Examiner* — Peter Novak
(74) *Attorney, Agent, or Firm* — Patent Law Group LLP; Brian D. Ogonowsky

(57) ABSTRACT

An output capacitor of a switching converter filters the triangular current waveform output by an inductor. An auxiliary capacitor, having a capacitance that is much smaller than a capacitance of the output capacitor, is coupled in parallel with the output capacitor so as to conduct a portion of the inductor current. A slope detector circuit determines a slope of the auxiliary capacitor current, and outputs a slope signal corresponding to the slope. A process circuit receives the slope signal and a signal corresponding to the inductor current. Since the auxiliary capacitor current slope is known, along with the auxiliary capacitance value and inductor current, the process circuit can derive the value of the output capacitor by applying a scaling factor. The derived value can be used to dynamically tweak the compensation of the feedback loop or identify a failure of the output capacitor.

23 Claims, 5 Drawing Sheets

DETECTING VALUE OF OUTPUT CAPACITOR IN SWITCHING REGULATOR

FIELD OF THE INVENTION

This invention relates to switch mode power supplies, such as DC/DC converters, and, in particular, to a technique to determine the capacitance value of the smoothing output capacitor.

BACKGROUND

FIG. 1 illustrates one type of prior art current mode DC/DC switching power supply, also known as a peak current mode DC/DC converter. The converter is a buck converter since the output voltage Vout is lower than the input voltage Vin. Many other converter types, such as a switching voltage mode converter, can also benefit from the present invention.

The operation of the converter is conventional and is as follows.

A clock (CLK) signal is applied to the set input of an RS flip-flop 20.

The setting of the RS flip-flop 20 generates a high signal at its Q output. A logic circuit 24, in response, turns the transistor switch 26 on and turns the synchronous rectifier switch 28 off. Both switches may be MOSFETs or other types of transistors. A diode may replace the synchronous rectifier switch 28. The logic circuit 24 ensures that there is no cross-conduction of switches 26 and 28. The input voltage Vin applied to an inductor L1 through the switch 26 causes a ramping current to flow through the inductor L1, and this current flows through a low value sense resistor 32. The sense resistor 32 may instead be located on the other side of the inductor L1. There are various other ways to detect the inductor current. The ramping current is filtered by an output capacitor Cout and supplies current to the load 38. The output capacitor Cout is relatively large to smooth out ripple.

The output voltage Vout is applied to a voltage divider 42, and the divided voltage is applied to the inverting input of a transconductance error amplifier 44. Capacitors may be connected across the resistors in the divider 42 to further compensate the feedback loop. A reference voltage Vref is applied to the non-inverting input of the amplifier 44. The output current of the amplifier 44 corresponds to the difference between the actual output voltage Vout and the desired output voltage. The voltage (a control voltage Vc) at a capacitor 46, connected to the output of the amplifier 44, is adjusted up or down based on the positive or negative current output of the amplifier 44. The RC time constant of the capacitor 46 and resistor 47 can be adjusted to compensate the feedback loop to improve stability. The transconductance (gm) of the error amplifier 44 can also be adjusted to improve stability. The control voltage Vc, among other things, sets the duty cycle of the switch 26, and the level of the control voltage Vc is that needed to equalize the inputs into the amplifier 44.

The control voltage Vc is applied to a comparator 50. The ramping voltage drop across the sense resistor 32, when the switch 26 is on, is sensed by a differential amplifier 52, which outputs the voltage Visense proportional to the inductor current. When the voltage Visense exceeds the control voltage Vc, the comparator 50 is tripped to output a reset pulse to the RS flip-flop 20. This turns the switch 26 off and turns the synchronous rectifier switch 28 on to discharge the inductor L1, causing a downward ramping current. In this way, the peak current through the inductor L1 for each cycle is regulated to generate a desired output voltage Vout. The current through the sense resistor 32 includes a DC component (the lower frequency, average current) and an AC component (the higher frequency, ripple current).

FIG. 2 shows an example of the ramping voltage Visense (or the inductor current). The DC load current is the average of the triangular waveform.

In some systems powered by the buck converter, it is vital to maintain a reliable output voltage. The capacitance of the output capacitor Cout typically reduces with age, stresses, and temperature variations. This is especially true when the buck converter is powering high current equipment, such as servers and motors. When the output capacitor capacitance reduces, the ripple in the output voltage may exceed a desired amount. Further, when the capacitance reduces, it may result in large perturbations in the output voltage during load transients, which may not be acceptable for certain loads. Such poor regulation can cause instability and indicate failure of the output capacitor.

What is needed is a technique for use in a switching converter that automatically detects the real time value of the output capacitor. Such information may be used to identify an output capacitor failure or to automatically adjust the compensation of the feedback loop to improve stability.

SUMMARY

A circuit for deriving the real time value of the output capacitor in a switching power supply, such as a buck regulator, is disclosed. The switching power supply uses an output inductor, which outputs a triangular waveform at the switching frequency. The relatively large output capacitor smooths the waveform to provide a DC voltage to the load.

A small auxiliary capacitor, which may be on the order of 1/1000th the value of the output capacitor, is connected in parallel with the output capacitor. The slope of the current (positive or negative) into the auxiliary capacitor is determined, and the slope is inversely proportional to the value of the output capacitor.

The AC current into the output capacitor is approximately the AC inductor current $i_L$, so the current into the auxiliary capacitor is approximately $(Caux/Cout)*i_L$. Therefore, the AC current into the auxiliary capacitor is increased as the capacitance of the output capacitor goes down. The slope of the auxiliary capacitor current is related to the current into the auxiliary capacitor and thus to the capacitance of the output capacitor. The slope is detected, and the voltage (Vslope) corresponding to the slope is inversely proportional to the capacitance of the output capacitor. This Vslope is then used to automatically optimize the compensation of the feedback loop, or determine if the output capacitor has gone below a threshold value, or for any other purpose.

If the auxiliary capacitor current was subtracted from the inductor current, the slope of the difference signal would be directly proportional to the capacitance of the output capacitor.

The circuit may be used to greatly increase the reliability of switching power supplies.

The auxiliary capacitor current waveform may also be used to identify the equivalent series resistance (ESR) of the output capacitor. The derived ESR may then be used to optimize the compensation of the feedback loop.

Various other embodiments are described.

BRIEF DESCRIPTION OF THE DRAWINGS

Elements that are the same or equivalent are labeled with the same numeral.

DETAILED DESCRIPTION

Figure 3:
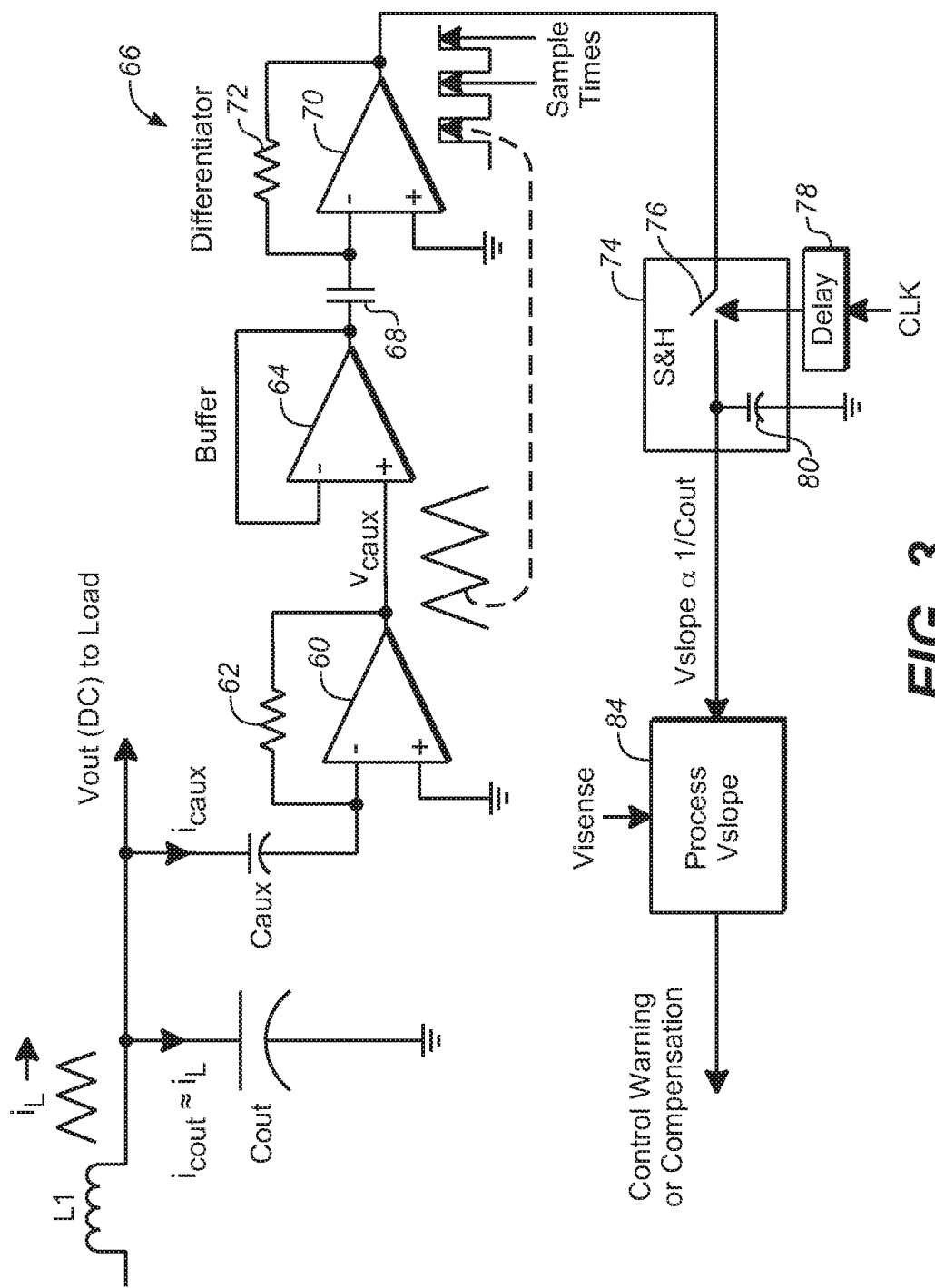
FIG. 3 illustrates an embodiment of the invention coupled to the output of a switching power supply, where a voltage directly related to the value of the output capacitor is derived from the current into the auxiliary capacitor.

FIG. 3 illustrates one embodiment of the invention that can be added to any suitable switching power supply. The detection of the auxiliary capacitor current is performed while the output capacitor is coupled to the inductor. Some types of switching power supplies always have the output capacitor coupled to the inductor, such as buck converters and forward converters. Other types of power supplies intermittently disconnect the output capacitor from the inductor. In such types, the detection of the auxiliary capacitor current occurs during the times that the output capacitor is connected to the inductor. Examples of power supplies that may make use of the invention include current mode converters, voltage mode converters, buck converters, boost converters, buck-boost converters, SEPIC converters, Cuk converters, flyback converters, forward converters, etc. The inductor L1 and output capacitor Cout represent the output inductor and capacitor in any suitable converter, such as the current mode buck converter of FIG. 1.

The circuit of FIG. 3 basically derives the slope of the current into a small auxiliary capacitor connected in parallel with the output capacitor. The current will typically be a triangular waveform. The slope is inversely proportional to the capacitance of the output capacitor. The slope, corresponding to the derived voltage Vslope, can then be used to automatically compensate the feedback loop to optimize it as the output capacitor changes over time, or used to identify if the capacitance of the output capacitor has degraded below a threshold, or for any other purpose.

There are many ways to derive the slope of the auxiliary capacitor current, and FIG. 3 just illustrates one way.

Figure 1:
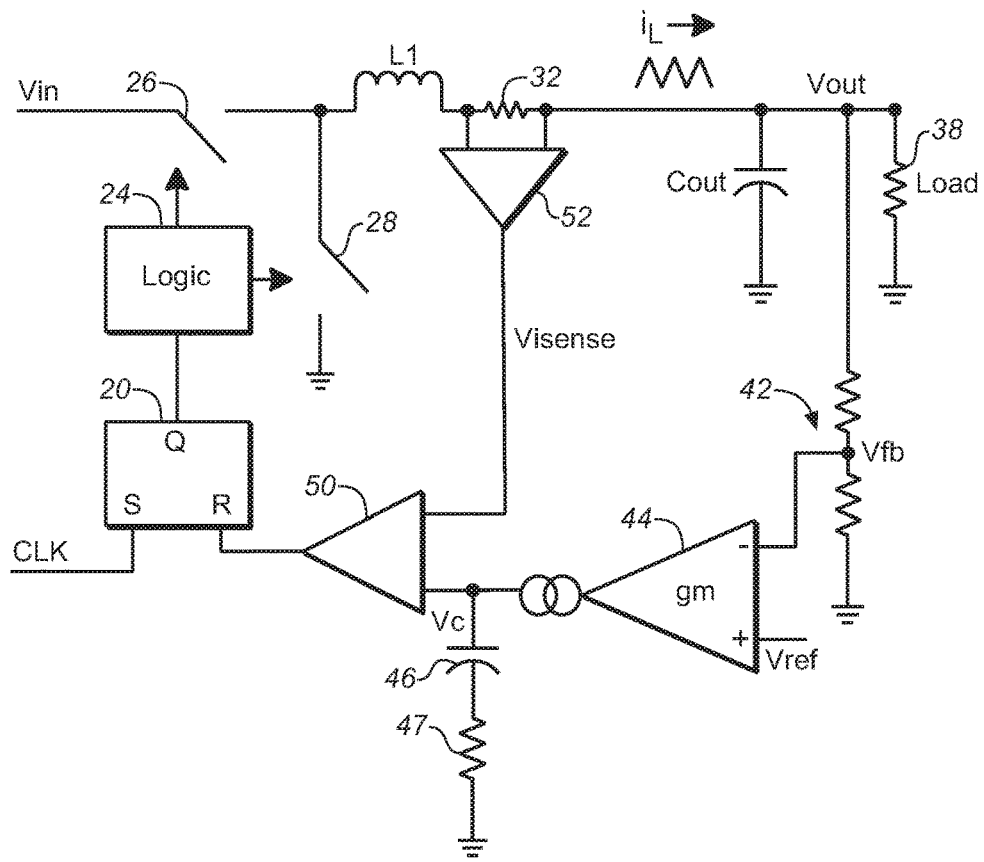
FIG. 1 illustrates a prior art DC/DC current mode converter.
Figure 2:
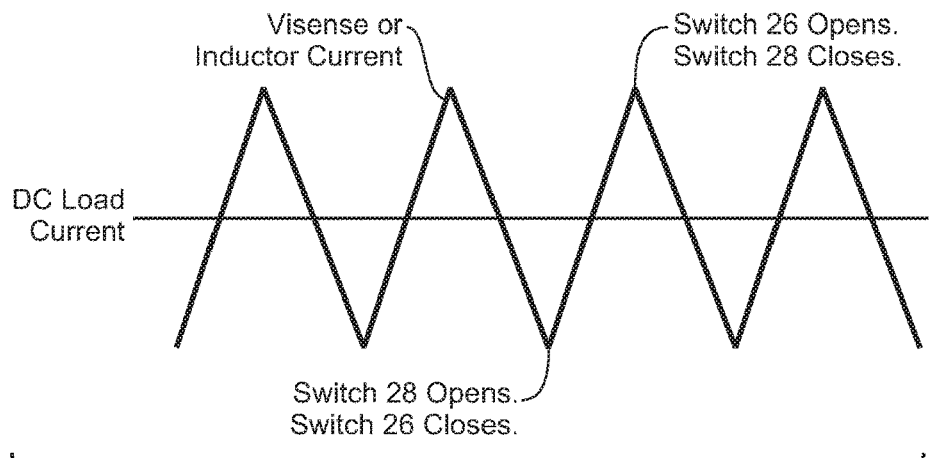
FIG. 2 illustrates a sample waveform during operation of the converter of FIG. 1.
Figure 4A:
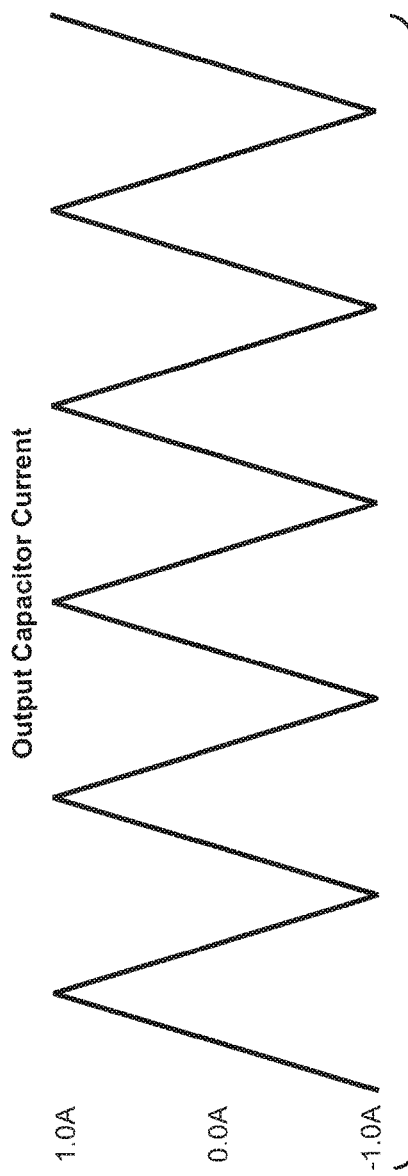
FIG. 4A illustrates the AC current into the large output capacitor in FIG. 3, which is approximately the AC inductor current, at the switching frequency.

In FIG. 3, while the switching regulator is in its steady state, the inductor L1 outputs a triangular waveform, where the average current is the DC current supplied to the load, such as the load 38 in FIG. 1. The AC component is filtered by the relatively large output capacitor Cout. The current into the output capacitor Cout is approximately the AC inductor current $i_L$. The DC voltage at the output capacitor Cout is the output voltage Vout of the converter. An example of the AC current into the output capacitor Cout is shown in FIG. 4A. The example shows the current ramp between 1 Amp and −1 Amp.

Figure 4B:
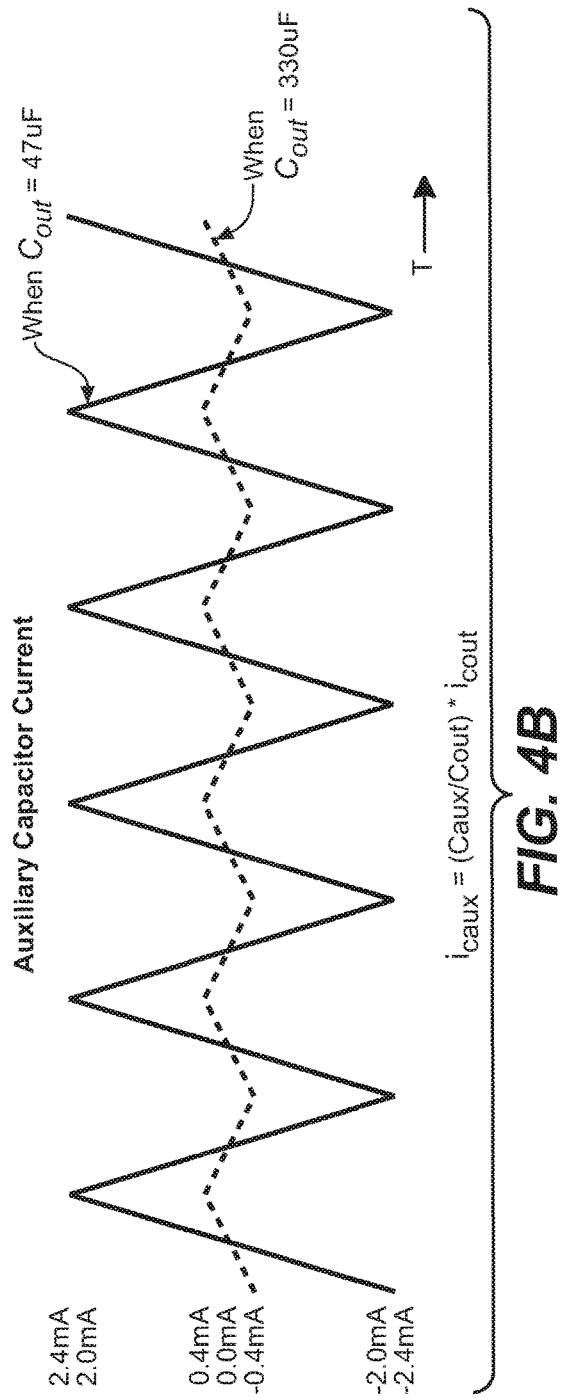
FIG. 4B illustrates the AC current into the small auxiliary capacitor in FIG. 3, which may be on the order of 1/1000 that of the current into the output capacitor. The current into the auxiliary capacitor is shown for output capacitor values of 47 μF and 330 μF.

A much smaller auxiliary capacitor Caux is connected in parallel with the output capacitor Cout. The value of the auxiliary capacitor Caux can be very small, such as on the order of 1/100th to less than 1/1000th that of the output capacitor Cout, so the current into the auxiliary capacitor Caux ($i_{caux}$) is approximately (Caux/Cout)*$i_L$. The current into the auxiliary capacitor may be a positive or negative ramping current. An example of the current into the auxiliary capacitor Caux is shown in FIG. 4B. The example shows the auxiliary capacitor Caux current ramp between 2 mA and −2 mA for an output capacitor Cout value of 47 μF and a much smaller current ramp between 0.4 mA and −0.4 mA for an output capacitor Cout value of 330 μF. The value of the auxiliary capacitor Caux is approximately 0.1 μF. As seen by the waveforms, the slope of the auxiliary capacitor current is inversely proportional to the capacitance of the output capacitor Cout.

The voltage at the bottom terminal of the auxiliary capacitor Caux is maintained at the AC ground of 0 volts using the op amp 60. Therefore, both the output capacitor Cout and the auxiliary capacitor Caux are coupled across Vout and 0 volts. The feedback resistor 62 sets the gain of the op amp 60. The the non-inverting input of the op amp 60 is coupled to ground (or another reference voltage), and the inverting input is connected to the auxiliary capacitor Caux. The feedback tries to keep the inputs matched so that the bottom terminal of the auxiliary capacitor Caux is maintained at the AC ground of 0 volts. The output of the op amp 60 (Vcaux) directly corresponds to the current into the auxiliary capacitor Caux. The output of the op amp 60 may be a triangular waveform, depending on the ESR of the output capacitor Cout.

The auxiliary capacitor Caux current could also have been detected by a circuit connected between the auxiliary capacitor Caux and the inductor L1, such as by using a low value sense resistor.

The current signal is then buffered by a buffer 64 and applied to a differentiator 66 to identify the slope of the current waveform. The differentiator 66 comprises a capacitor 68, an op amp 70, and a feedback resistor 72. The output of the differentiator 66 will be approximately a square wave. The crest of the square wave is a voltage corresponding to the downslope of the current ramp output by the op amp 60, and the trough of the square wave is a voltage corresponding to the upslope of the current ramp. The slope magnitudes may be the same but of opposite polarity.

A sample and hold circuit 74 samples the slope values at the clock rate of the converter, such as using a delayed CLK signal from the clock in FIG. 1. In the example of FIG. 3, the sampling switch 76 is closed for a brief moment by the delayed CLK signal, delayed by the delay circuit 78. This sampled value is stored in a hold capacitor 80 until the next sampling time. The sample and hold circuit 74 may also include a discharge circuit for resetting the capacitor 80 voltage prior to each sampling time.

The output of the sample and hold circuit 74 is a voltage Vslope that is proportional to 1/Cout. The actual value of the output capacitor Cout can therefore be simply calculated by applying a scaling factor to Vslope. The scaling factor takes into account the inductor current, the value of the auxiliary capacitor Caux, the relationship between slope and the auxiliary capacitor Caux current, and the various gains in the system. The proper scaling factor may be determined by simulation.

A process circuit 84 receives a signal corresponding to the inductor current, such as the Visense signal in FIG. 1. The Vcaux signal (output from the op amp 60) and Visense must be properly scaled to reflect the actual ratio of the inductor current to the auxiliary capacitor current. If scaling is required, it may be done using a voltage divider or by other methods. The process circuit 84 is designed for a particular value of the auxiliary capacitor Caux. Since Vslope has a known relationship to the current into the auxiliary capacitor Caux, and the inductor current and the value of the auxiliary capacitor Caux are known, then the following equation can be solved for Cout: Cout=Caux*$i_L/i_{caux}$.

The process circuit 84 can use digital or analog hardware or a processor to derive a voltage corresponding to the value of the output capacitor Cout. A lookup table may also be used that receives the inductor current signal and Vslope and outputs the output capacitor Cout value or some other signal corresponding to the real time value of the output capacitor Cout. The process circuit 84 basically multiplies Vslope by a scaling factor to generate an output signal corresponding to the real time value of the output capacitor Cout. Controllable scaling circuits are well known. One skilled in the art can easily determine which type of process circuit 84 is best to use for a particular application.

Figure 5A:
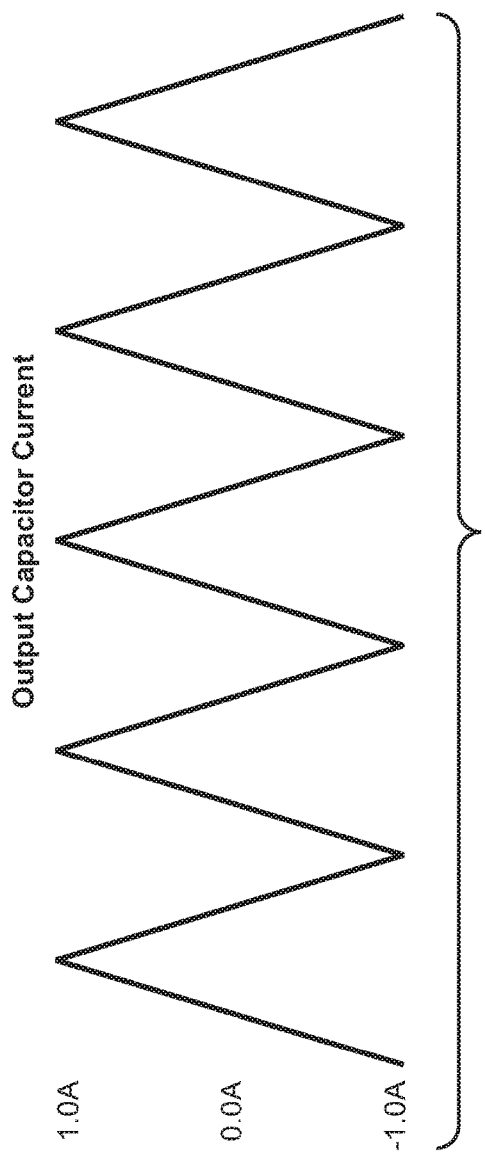
FIGS. 5A and 5B are waveforms of the AC current into the output capacitor and auxiliary capacitor, respectively, when the equivalent series resistance (ESR) of the output capacitor is relatively high. The current into the auxiliary capacitor is shown for output capacitor values of 47 μF and 330 μF. The slopes are the same in FIGS. 4A and 4B.
Figure 5B:
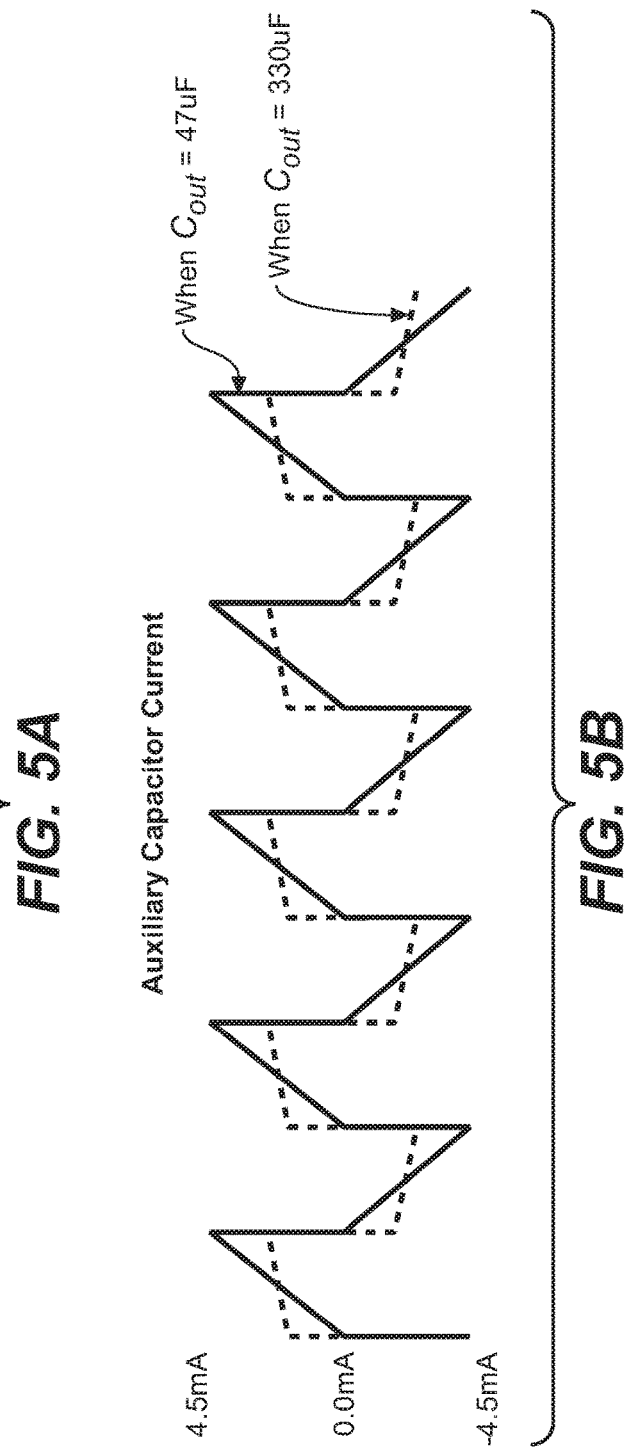

FIGS. 5A and 5B are waveforms of the current into the output capacitor Cout and auxiliary capacitor Caux, respectively, when the equivalent series resistance (ESR) of the output capacitor is relatively high. The slopes are the same as in FIGS. 4A and 4B but there is a DC voltage drop cause by the current through the equivalent series resistor (ESR) of the output capacitor Cout which shifts the waveform up or down. Only the slopes are relevant, which do not change with ESR.

Figure 6:
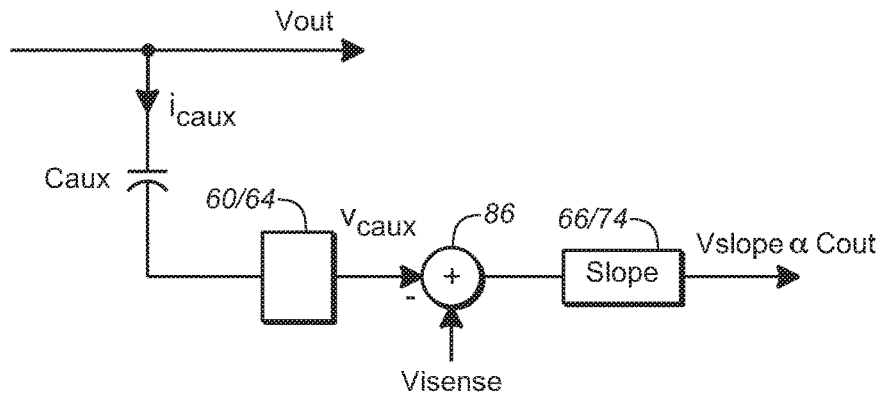
FIG. 6 illustrates a subtractor that subtracts an auxiliary current signal from the inductor current signal, where the difference signal is then applied to the differentiator in FIG. 3 to generate a slope signal that is directly proportional to the capacitance of the output capacitor.

In another embodiment, the auxiliary capacitor Caux current is subtracted from the inductor current, and the slope of that difference is derived. The slope is then proportional to the output capacitor Cout value and is thus used to determine the real time value of the output capacitor Cout. FIG. 6 shows a circuit that may be inserted before the differentiator 66 in FIG. 3 for generating the difference signal. The auxiliary capacitor Caux current is processed by the op amp 60 and buffer 64 of FIG. 3, and the corresponding voltage signal Vcaux is applied to a subtractor 86, which subtracts Vcaux from the inductor current signal Visense (FIG. 1). The two signals must be scaled properly to accurately reflect the ratio of the inductor current to the auxiliary capacitor current. The resulting difference signal is then processed by the differentiator 66 and sample and hold circuit 74 to generated a Vslope signal that is directly proportional to the capacitance of the output capacitor.

Figure 7:
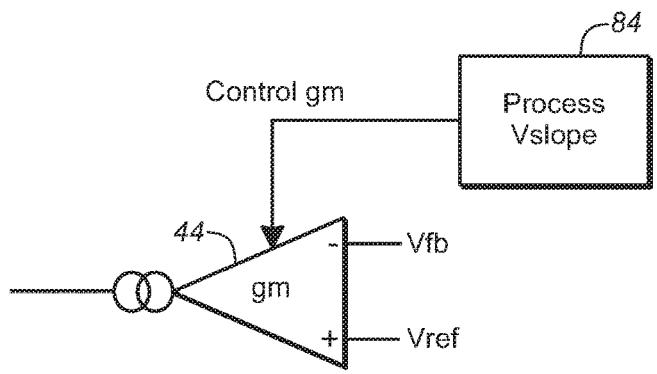
FIG. 7 illustrates one use of the derived output capacitor value in controlling the gm of the error amplifier to optimize compensation of the feedback loop.

The output of the process circuit 84 may be used for any purpose. One purpose is shown in FIG. 7, where the output of the process circuit 84, corresponding to the real time value of the output capacitor Cout, is used to control the transconductance (gm) of the error amplifier 44 of FIG. 1 to optimize the gm for stabilizing the feedback loop. The output could have also been used to tweak any compensation RC circuit in the feedback loop. This allows the user to use a wide range of output capacitor Cout values without adversely affecting the stability of the converter. For example, the user may want to use a relatively small output capacitor Cout due to size or cost limitations, and the process circuit 84 would automatically adjust the compensation circuit for that particular output capacitor Cout.

Figure 8:
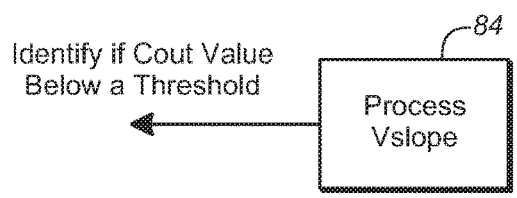
FIG. 8 illustrates another use of the derived output capacitor value in determining a failure of the output capacitor or that the capacitance has gone below a threshold level.

FIG. 8 illustrates an example where the process circuit 84 or another circuit determines that the capacitance of the output capacitor Cout has fallen below an acceptable threshold. As a result, a warning signal may be issued and the output capacitor Cout is replaced. This is a very significant problem for high power converters that power vital equipment, such as servers, where there is a lot of stress on the output capacitor that accelerates its aging. Aging will typically cause the capacitance value to be reduced over time, which increases the ripple of the converter's output voltage. Extremely low temperatures may also cause the output capacitor to have an unacceptably low capacitance. To determine whether the capacitance has fallen below a threshold, the process circuit 84 derives a signal corresponding to the output capacitance value and compares it to a threshold value using a comparator.

Although the example illustrates a differentiator 66 to determine the slope, other circuits may be used to calculate the slope, such as a circuit that subtracts two samples of the ramp signal and divides the difference by time.

Figure 9:
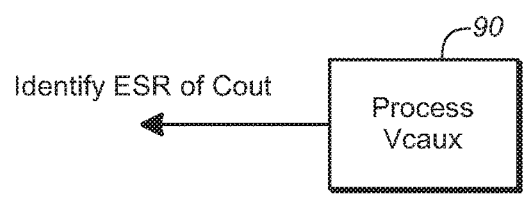
FIG. 9 illustrates additional use of the circuit in deriving the ESR of the output capacitor from the auxiliary current waveform, where the ESR may be used to compensate the feedback loop or identify a failure of the output capacitor.

As shown in FIG. 5B, the DC shift of the auxiliary capacitor current, if any, can be detected to determine the ESR of the output capacitor Cout. The ESR is proportional to the shift. As shown in FIG. 9, an additional process circuit 90 is used to detect Vcaux (a voltage corresponding to the auxiliary capacitor current) and then derive the ESR of the output capacitor Cout. The ESR adds perturbations to the output voltage Vout of the converter. The derived ESR may be used to improve compensation of the feedback loop or identify a failure of the output capacitor Cout.

Since inductors and output capacitors are typically relatively large components, they are often provided external to the integrated circuit that contains the control circuitry for the switching power supply. Multiple output capacitors may be connected in parallel to provide the desired capacitance, and the combination of such capacitors is considered to be a single output capacitor. Since the auxiliary capacitor Caux and its related circuitry in FIG. 3 can be very small, it may be located on the same die as the control circuitry for the switching power supply and so implementing the invention in a switching power supply incurs no additional cost. For example, the combined circuits of FIGS. 1 and 3, except for the RC compensation network, load, voltage divider, inductor L1 and output capacitor Cout, may be provided on a single chip.

While particular embodiments of the present invention have been shown and described, it will be obvious to those skilled in the art that changes and modifications may be made without departing from this invention in its broader aspects and, therefore, the appended claims are to encompass within their scope all such changes and modifications that are within the true spirit and scope of this invention.

What is claimed is:

1. A circuit for use with a switching converter having an output capacitor for filtering a current output by an inductor, the circuit comprising:

an auxiliary capacitor having a capacitance that is smaller than a capacitance of the output capacitor, the auxiliary capacitor configured to be coupled to a first terminal of the output capacitor so as to conduct a portion of the current output by the inductor, the portion being an auxiliary capacitor current having a slope;

a slope detector circuit coupled to receive a first signal corresponding to the auxiliary capacitor current to determine a slope of the auxiliary capacitor current, the slope detector circuit for outputting a slope signal corresponding to the slope; and a process circuit configured to receive the slope signal to derive a second signal corresponding to a value of the output capacitor.

2. The circuit of claim 1 wherein the slope detector circuit comprises:

a differentiator for receiving the first signal corresponding to the auxiliary capacitor current and outputting a slope waveform corresponding to the slope of the auxiliary capacitor current; and a sample and hold circuit for sampling the slope waveform for generating the slope signal for processing by the process circuit.

3. The circuit of claim 1 wherein the capacitance of the auxiliary capacitor is less than one-hundredth the capacitance of the output capacitor.

4. The circuit of claim 1 wherein the process circuit is configured to receive, along with the slope signal, an inductor current signal proportional to the current output by the inductor.

5. The circuit of claim 4 wherein the process circuit is configured to use the known capacitance of the auxiliary capacitor, the inductor current signal, and the slope signal to derive the second signal corresponding to the value of the output capacitor.

6. The circuit of claim 1 wherein the circuit is formed on a single die along with control circuitry for the switching converter.

7. The circuit of claim 1 wherein the auxiliary capacitor is coupled between the first terminal of the output capacitor and a reference voltage.

8. The circuit of claim 7 wherein the reference voltage is an AC ground.

9. The circuit of claim 7 wherein the auxiliary capacitor has a first terminal configured to be coupled to the first terminal of the output capacitor and a second terminal coupled to an inverting input of an op amp, wherein a non-inverting input of the op amp is coupled to the reference voltage, and wherein an output of the op amp is fed back to the inverting input as a feedback signal, whereby the feedback signal maintains the second terminal of the auxiliary capacitor at approximately the reference voltage.

10. The circuit of claim 1 wherein an output of the process circuit controls parameters of a feedback loop in the switching converter.

11. The circuit of claim 10 wherein the output of the process circuit controls a transconductance of an error amplifier in the switching converter.

12. The circuit of claim 10 wherein the output of the process circuit tweaks the feedback loop to improve a stability of the switching converter.

13. The circuit of claim 10 wherein the output of the process circuit tweaks a compensation circuit in the feedback loop to improve the stability of the switching converter.

14. The circuit of claim 1 wherein an output of the process circuit identifies whether the capacitance of the output capacitor has fallen below a threshold.

15. The circuit of claim 1 wherein the slope signal is a voltage proportional to 1/Cout, where Cout is the capacitance of the output capacitor.

16. The circuit of claim 1 wherein the slope signal is a voltage proportional to Cout, where Cout is the capacitance of the output capacitor.

17. The circuit of claim 1 wherein the process circuit multiplies the slope signal by a scaling factor to derive the second signal corresponding to the value of the output capacitor.

18. The circuit of claim 1 wherein the process circuit is a first process circuit, the circuit further comprising:

a second process circuit coupled to receive the first signal corresponding to the auxiliary capacitor current and derive an equivalent series resistance (ESR) of the output capacitor.

19. The circuit of claim 18 wherein the second process circuit scales a DC voltage shift in the first signal, corresponding to the ESR, to derive the ESR.

20. The circuit of claim 1 further comprising the switching converter, the switching converter comprising:

one or more switching transistors for supplying current to the inductor;

control circuitry for controlling a duty cycle of the one or more switching transistors to output a target output voltage to a load; and the output capacitor for smoothing the current output from the inductor.

21. The circuit of claim 1 wherein the switching converter is a buck converter.

22. A method performed by a switching converter comprising:

controlling one or more switching transistors for supplying current to an inductor, the inductor outputting a ramping current waveform;

controlling a duty cycle of the one or more switching transistors to output a target output voltage to a load;

smoothing the ramping current waveform using an output capacitor;

detecting a slope of an auxiliary capacitor current, wherein an auxiliary capacitor having a capacitance that is smaller than a capacitance of the output capacitor is coupled to a first terminal of the output capacitor so as to conduct a portion of the current output by the inductor, the portion being the auxiliary capacitor current having the slope;

detecting the slope of the auxiliary capacitor current, and outputting a slope signal corresponding to the slope; and processing the slope signal to derive a capacitance value signal corresponding to a value of the output capacitor.

23. The method of claim 22 wherein detecting the slope comprises:

using a differentiator for receiving the auxiliary capacitor current and outputting a slope waveform corresponding to the slope of the auxiliary capacitor current; and sampling the slope waveform for generating the slope signal.

* * * * *